United States Patent

Rabjohns et al.

Patent Number: 5,111,457
Date of Patent: May 5, 1992

[54] DETECTION AND RECOVERY FROM AN NVM DATA INTEGRITY FAILURE

[75] Inventors: Douglas T. Rabjohns, Fairport; Robert M. VanDuyn, Rochester; Dale T. Platteter, Fairport, all of N.Y.

[73] Assignee: Xerox Corporation, Stamford, Conn.

[21] Appl. No.: 427,076

[22] Filed: Oct. 26, 1989

[51] Int. Cl.$^5$ .................. G11C 29/00; G11B 20/18
[52] U.S. Cl. .................. 371/10.1; 371/16.4
[58] Field of Search ... 364/200 MS File, 900 MS File; 371/13, 66, 10.1, 16.4

[56] References Cited

U.S. PATENT DOCUMENTS

| | | | |
|---|---|---|---|
| 4,380,047 | 4/1983 | Eisenhard et al. | 364/200 |
| 4,393,500 | 7/1983 | Imazeki et al. | 371/13 |
| 4,458,349 | 7/1984 | Aichelmann, Jr. et al. | 371/13 |
| 4,584,663 | 4/1986 | Tanikawa | 364/900 |
| 4,698,808 | 10/1987 | Ishii | 371/21.5 |
| 4,819,237 | 4/1989 | Hamilton et al. | 371/66 |

OTHER PUBLICATIONS

"Data Protection and Management Method for Non-Volatile Memory", *IBM Technical Disclosure Bulletin*, vol. 31, No. 4, Sep. 1988, pp. 459–461.

Primary Examiner—Stephen M. Baker
Attorney, Agent, or Firm—Ronald F. Chapuran

[57] ABSTRACT

The method of verifying the integrity of the non-volatile memory device contents in an image processing apparatus having image processing for forming an image, a controller for directing the operation of the image processing, a mass memory device and a non-volatile memory device for dynamically storing critical machine data comprising the steps of performing a non-volatile memory check including the steps of verifying selected patterns and verifying a checksum related to the non-volatile memory, determining a non-volatile memory fault during the process of performing the non-volatile memory check, retrieving backup critical machine data from the mass memory device, storing the critical machine data into the non-volatile memory device, and providing dynamically updated data backup of the non-volatile memory image to the mass memory device.

1 Claim, 5 Drawing Sheets

DETECTION AND RECOVERY FROM AN NVM DATA INTEGRITY FAILURE

BACKGROUND OF THE INVENTION

The invention relates to a system for reproduction machine control, and more particularly, to a technique for the maintenance and recovery from an NVM (non-volatile memory) data integrity failure for such reproduction machines.

As reproduction machines such as copiers and printers become more complex and versatile in executing job requirements, the importance of permanently maintaining a wide range of data such as processing conditions and fault history, customer data, and job related information becomes even more critical for production efficiency and record keeping. It is customary to store critical information in non-volatile memory (NVM) as a precaution against information loss due to power loss and machine shutdown. However, due to such factors as electrical noise and the failure of the NVM itself, there is always the potential of losing vital NVM data.

In the prior art there are examples of non-volatile memories and attempts to maintain permanent data. For example:

U.S. Pat. No. 4,393,500 to Imazeki et al. discloses a method of modifying data stored in non-volatile memory wherein a binary 1 is written into an area of the non-volatile memory and can be checked later to see if any problems occurred. See col. 4, lines 27-31. A bubble memory is used as a non-volatile memory.

U.S. Pat. No. 4,584,663 to Tanikawa discloses an apparatus for a power-on data integrity check for volatile memory, but a similar method can also be used for non-volatile memory. See col. 4, lines 44-46. A means is provided to test a memory using another copy of the same contents as that memory. See col. 3, lines 50-55.

U.S. Pat. No. 4,458,349 to Aichelmann, Jr. et al. discloses a method of storing data words in fault tolerant memory in which a check byte is stored with a data word (see col. 4, lines 18-22) and can then later be checked. See col 4, lines 27-30. A means is also provided to correct single bit errors.

U.S. Pat. No. 4,698,808 to Ishii discloses a method of detecting intermittent errors in volatile memory in which a checksum is used to test a memory. See col. 2, lines 23-29. A means is also provided to copy over corrupted data with fresh data. See col. 3, lines 10-12.

U.S. Pat. No. 4,819,237 to Hamilton et al. discloses a method for monitoring the validity of volatile memory in which a bit pattern is used to detect corruption in a memory. See col. 2, lines 41-49. A means is provided to check this pattern later against a copy which resides in non-volatile memory.

A difficulty with the prior art machine systems is the difficulty in maintaining status and restoring a machine to the proper parameters during operation. It would be desirable to be able to provide a simple and relatively inexpensive method to save and restore machine parameters. Another difficulty with the prior art is the relatively complex and time consuming operation that is required to transfer NVM data to a mass storage memory and also the susceptibility of a non-volatile memory to real time malfunctions.

It is an object, therefore, of the present invention to provide a method to automatically check the integrity of a non-volatile memory in real time and to be able automatically to save and restore non-volatile memory data. Other advantages of the present invention will become apparent as the following description proceeds, and the features characterizing the invention will be pointed out with particularity in the claims annexed to and forming a part of this specification.

SUMMARY OF THE INVENTION

Briefly, the present invention is the method of verifying the integrity of the non-volatile memory in an image processing apparatus having image processing means for forming an image, a controller for directing the operation of the image processing means, a mass memory device and a non-volatile memory for dynamically storing image processing information comprising the steps of performing a non-volatile memory check including the steps of verifying selected patterns and verifying a checksum related to the non-volatile memory, determining a non-volatile memory fault during the process of performing the non-volatile memory check, retrieving backup image processing information from the mass memory device, storing the retrieved image processing information into the non-volatile memory, and providing dynamically updated data backup of the non-volatile memory to the mass memory device.

For a better understanding of the present invention, reference may be had to the accompanying drawings wherein the same reference numerals have been applied to like parts and wherein:

DETAILED DESCRIPTION OF THE DRAWINGS

DETAILED DESCRIPTION OF THE PREFERRED EMBODIMENT

Figure 1:
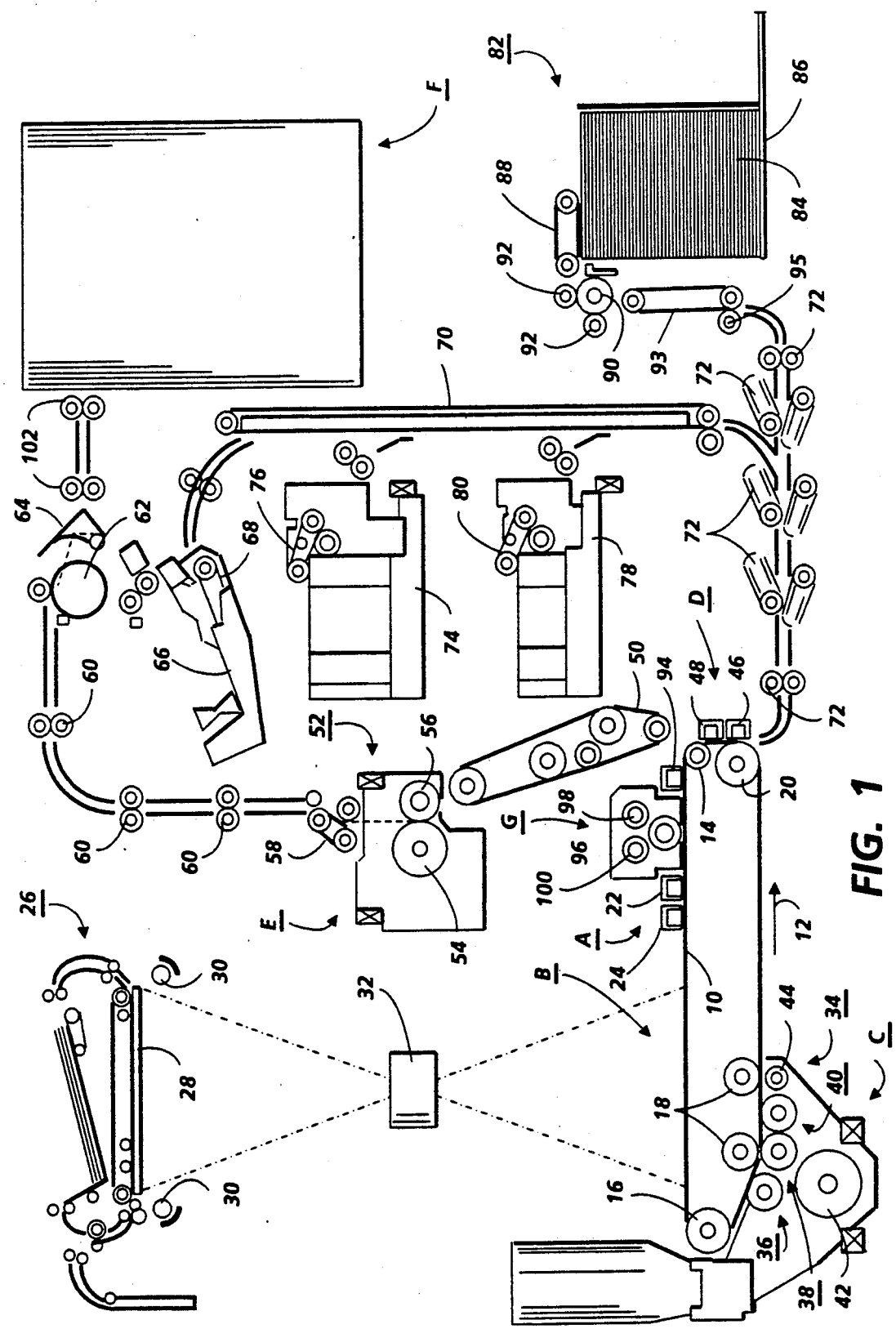
FIG. 1 is a schematic elevational view of an illustrative reproduction machine.

For a general understanding of the features of the present invention, reference is made to the drawings. In the drawings like reference numerals have been used throughout to identify identical elements. Referring to FIG. 1, there is shown an electro-photographic reproduction machine composed of a plurality of programmable components and sub-systems which cooperate to carry out the copying or printing job.

The machine employs a photoconductive belt 10. Belt 10 is entrained about stripping roller 14, tensioning roller 16, idler rollers 18, and drive roller 20. Drive roller 20 is rotated by a motor coupled thereto by suitable means such as a belt drive. As roller 20 rotates, it advances belt 10 in the direction of arrow 12 through the various processing stations disposed about the path of movement thereof.

Initially, the photoconductive surface of belt 10 passes through charging station A where two corona generating devices, indicated generally by the reference numerals 22 and 24 charge photoconductive belt 10 to a relatively high, substantially uniform potential. Next, the charged photoconductive belt is advanced through imaging station B. At imaging station B, a document handling unit 26 sequentially feeds documents from a stack of documents in a document stacking and holding tray into registered position on platen 28. A pair of Xenon flash lamps 30 mounted in the optics cavity illuminate the document on platen 28, the light rays reflected from the document being focused by lens 32 onto belt 10 to expose and record an electrostatic latent image on photoconductive belt 10 which corresponds to the informational areas contained within the document currently on platen 28. After imaging, the document is returned to the document tray via a simplex path when either a simplex copy or the first pass of a duplex copy is being made or via a duplex path when a duplex copy is being made.

The electrostatic latent image recorded on photoconductive belt 10 is developed at development station C by a magnetic brush developer unit 34 having three developer rolls 36, 38 and 40. A paddle wheel 42 picks up developer material and delivers it to the developer rolls 36, 38. Developer roll 40 is a cleanup roll while a magnetic roll 44 is provided to remove any carrier granules adhering to belt 10.

Following development, the developed image is transferred at transfer station D to a copy sheet. There, the photoconductive belt 10 is exposed to a pre-transfer light from a lamp (not shown) to reduce the attraction between photoconductive belt 10 and the toner powder image. Next, a corona generating device 46 charges the copy sheet to the proper magnitude and polarity so that the copy sheet is tacked to photoconductive belt 10 and the toner powder image attracted from the photoconductive belt to the copy sheet. After transfer, corona generator 48 charges the copy sheet to the opposite polarity to detach the copy sheet from belt 10.

Following transfer, a conveyor 50 advances the copy sheet bearing the transferred image to fusing station E where a fuser assembly, indicated generally by the reference numeral 52 permanently affixes the toner powder image to the copy sheet. Preferably, fuser assembly 52 includes a heated fuser roller 54 and a pressure roller 56 with the powder image on the copy sheet contacting fuser roller 54.

After fusing, the copy sheets are fed through a decurler 58 to remove any curl. Forwarding rollers 60 then advance the sheet via duplex turn roll 62 o gate 64 which guides the sheet to either finishing station F or to duplex tray 66, the latter providing an intermediate or buffer storage for those sheets that have been printed on one side and on which an image will be subsequently printed on the second, opposed side thereof. The sheets are stacked in duplex tray 66 face down on to of one another in the order in which they are copied.

To complete duplex copying, the simplex sheets in try 66 are fed, in seriatim, by bottom feeder 68 back to transfer station D via conveyor 70 and rollers 72 for transfer of the second toner powder image to the opposed sides of the copy sheets. The duplex sheet is then fed through the same path as the simplex sheet to be advanced to finishing station F.

Copy sheets are supplied from a secondary tray 74 by sheet feeder 76 or from the auxiliary tray 78 by sheet feeder 80. Sheet feeder 76, 80 are friction retard feeder utilizing a feed belt and take-away rolls to advance successive copy sheets to transport 70 which advances the sheets to rolls 72 and then to transfer station D.

A high capacity feeder 82 is the primary source of copy sheets. Tray 84 of feeder 82, which is supported on an elevator 86 for up and down movement, has a vacuum feed belt 88 to feed successive uppermost sheets from the stack of sheets in tray 84 to take away drive roll 90 and idler rolls 92. Rolls 90, 92 guide the sheet onto transport 93 which in cooperation with idler roll 95 and rolls 72 move the sheet to transfer station station D.

After transfer station D, photoconductive belt 10 passes beneath corona generating device 94 which charges any residual toner particles remaining on belt 10 to the proper polarity. Thereafter, a pre-charge erase lamp (not shown), located inside photoconductive belt 10, discharges the photoconductive belt in preparation for the next charging cycle. Residual particles are removed from belt 10 at cleaning station G by an electrically biased cleaner brush 96 and two de-toning rolls 98 and 100.

The various functions of machine are regulated by a controller which preferably comprises one or more programmable microprocessors. The controller provides a comparison count of the copy sheets, the number of documents being recirculated, the number of copy sheets selected by the operator, time delays, and jam corrections. Programming and operating control over machine is accomplished through the User Interface. Operating and control information is stored in a suitable memory and loaded into controller and job programming instructions are loaded into the controller through the User Interface. Conventional sheet path sensors or switches may be utilized to keep track of the position of the documents and the copy sheets. In addition, the controller regulates the various positions of the gates depending upon the mode of operation selected.

Figure 2:
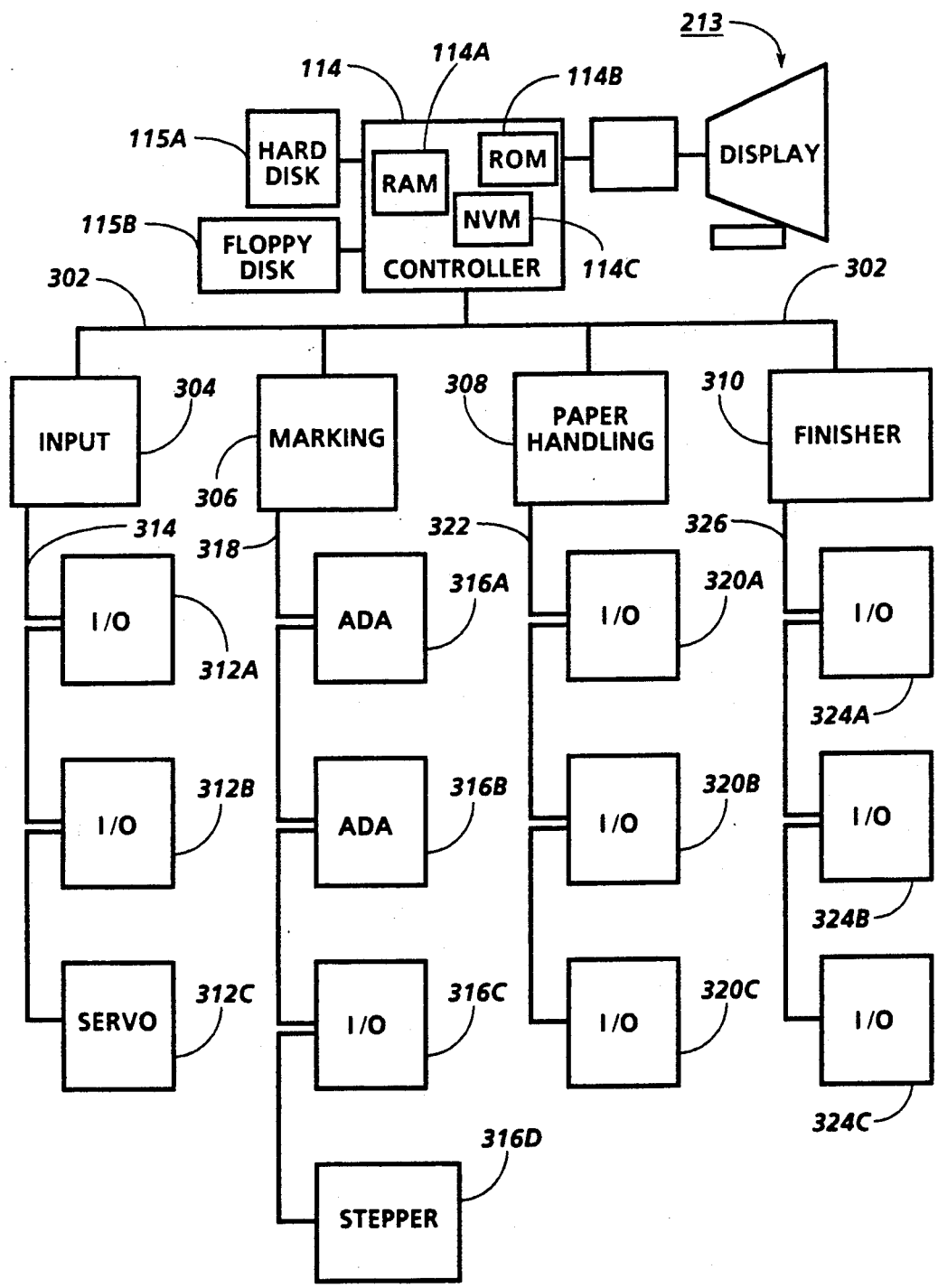
FIG. 2 is a block diagram of the operating control systems and memory for the machine shown in FIG. 1.

With reference to FIG. 2, the memory includes a hard or rigid disk driver 115A for receiving suitable rigid memory disks and a floppy disk drive 115B for receiving suitable floppy memory disks, both disk drives being electrically connected to Controller 114, the Controller 114 including RAM 114A and ROM 114B, and non-volatile memory NVM 114C. In a preferred embodiment, the rigid disks are two platter, four head disks with a formatted storage capacity of approximately 20 megabytes. The floppy disks are 3.5 inch, dual sided micro disks with a formatted storage capacity of approximately 720 kilobytes. The battery backed NVM 114C is a high speed CMOS RAM device with a permanent lithium power supply. In normal machine operation, all of the control code and screen display information for the machine is loaded from the rigid disk at machine power up. Alternatively, all of the control code and screen display information for the machine can be loaded from a floppy disk at machine power up using the floppy disk drive built into the machine. Suitable display 213A is also connected to Controller (SAN) 114 as well as a shared line system bus 302.

The shared line system bus 302 interconnects a plurality of core printed wiring boards or control boards or nodes including an input station board (ISN) 304, a marking imaging board 306, a paper handling board (PHN) 308, and a finisher/binder board (FBN) 310. Each of the core printed wiring boards is connected to local input/output (I/O) devices through a local bus. For example, the input station board 304 is connected to digital input/output boards 312A and 312B and servo board 312C via local bus 314. The marking imaging board 306 is connected to analog/digital/analog boards 316A, 316B, digital input/output board 316C, and stepper control board 316D through local bus 318. In a similar manner, the paper handling board 308 connects digital input/output boards 320A, B and C to local bus 322, and finisher/binder board 310 connects digital input/output boards 324A, B and C to local bus 326. For further details of the control, reference may be had to U.S. Ser. No. 07/164,365 filed Mar. 4, 1988 and incorporated herein. For further details of the control, reference may be had to U.S. Ser. No. 07/164,365 filed Mar. 4, 1988 and incorporated herein.

In accordance with the present invention, in general, although the battery backed memory or NVM 114C acts no different than any other RAM memory, it is never directly accessed by high level software functions. Instead all access goes through a low level software system which performs all read/write operations in a fashion that protects against the battery backed NVM 114C from being corrupted or destroyed by power failures or system crashes.

Whenever the system is powered on (or goes through system reset) the battery is tested by matching pattern bytes in the NVM device against a fixed pattern, and by verifying a checksum on the NVM data. The checksum is kept correct by updating it after each valid write to NVM. Thus an invalid checksum detects either a battery failure or uncontrolled modification of NVM (typically the result of an electrical noise problem.) Should these checks fail, the contents of NVM will be restored from a rigid disk backup file. The failure will be reported to the use as a NVM battery failure fault and the fault may be cleared allowing normal machine operation.

All data in the battery backed NVM 114C is copied to backup file on a rigid disk. The backup is performed after exiting any diagnostic program, and after each machine cycle down. This allows restoration of the NVM device after a NVM failure. This disk backup file is for all purposes considered an exact copy of the battery backed device. Before writing the backup file to the rigid disk the integrity checks (pattern and checksum) are made to insure that the invalid NVM image is not written to the rigid disk.

The contents of the NVM are restored by the control system as soon as the fault condition is detected, using a backup file stored on the rigid disk. Preferably, the fault remains displayed until a button is pushed by the operator. The purpose of this operator interaction is to insure that operator understands that the failure has occurred. Field support could then be notified. When the rigid disk backup file is used to recover from a NVM failure, the NVM integrity checks are again performed. If the tests fail (indicating the backup file is invalid) an unclearable (NVM not initialized) fault is declared. Field support could then also be notified.

Figure 3:
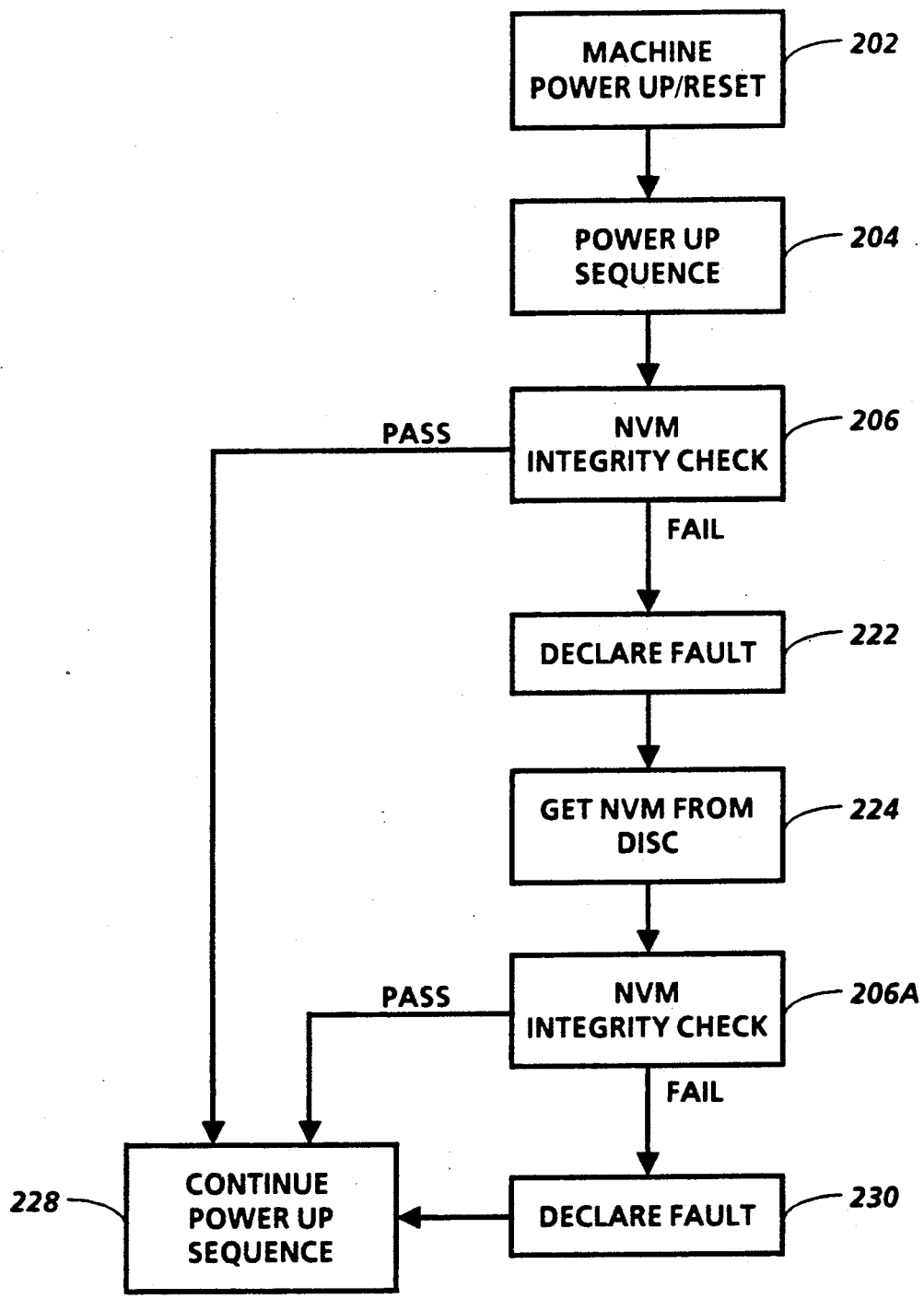
FIGS. 3-7 are flow charts of NVM maintenance and recovery techniques in accordance with the present invention.

In accordance with the present invention, with reference to FIg. 3, at a machine powerup or reset as indicated by block 202, if the contents of the NVM device 114C are invalid, there is a transfer of the NVM image from the rigid disk to NVM device 114C.

In particular, a NVM failure is usually a battery failure or initialization failure. A battery failure will appear after a power up or reset. The failure indicates that the contents of the NVM device are suspect. Several methods are used to check the contents of this NVM at powerup, the fault indicating one of the tests failed. Typically the failure is caused by a bad battery. The failure may occasionally occur because of a electrical noise destroying the contents of the device.

A NVM not initialized fault will appear after a controller 114 powerup/reset. The fault will appear when a new controller 114 is first powered up. The fault in general will not appear during normal field operation since it represents a secondary failure of the NVM. It may also occur during a service call that replaces both the controller and the rigid disk. When the fault occurs, it is necessary to read a valid backup file from the rigid disk. If this file does not contain a valid NVM image, there i no way to clear the NVM not initialized fault. The operator must call for service. The field representative will restore the NVM image from a floppy disk. In situations where this floppy is not available (i.e. in manufacturing) the NVM is initialized to defaults and integrity is restored.

Figure 5:
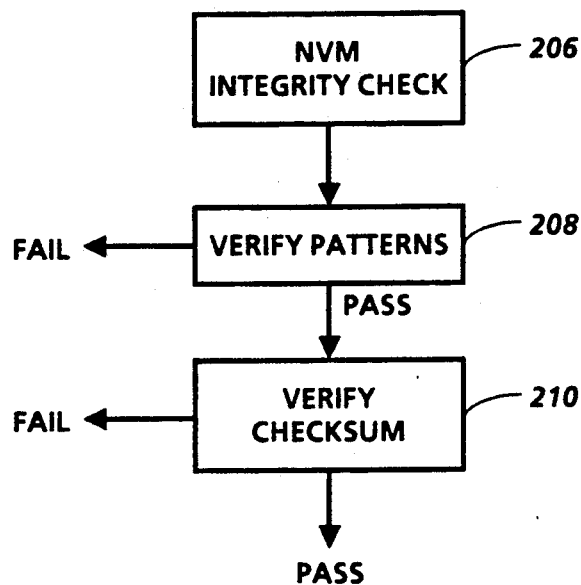

There is an NVM integrity check performed on the contents of the NVM device 114C as indicated by block 206. In general, as seen in FIG. 5, the NVM integrity check 206 includes a procedure to verify patterns as illustrated by block 208 and a procedure to verify a checksum as indicated by block 210. If the integrity check at 206 passes, control will continue with the power-up sequence as shown in block 228. If there is a failure of the NVM integrity check, a fault is declared as illustrated by the declare fault block 222 in FIG. 3. The declare fault operation 222 triggers a transfer of the backup NVM image from the rigid disk, as illustrated by block 224, to the NVM device. Upon transfer of the backup NVM image from the rigid disk to NVM device 114C, again there is performed an NVM integrity check 206A as shown in FIG. 3. A failure of the NVM integrity check 206A will result in a fault declared as shown at block 230. The declare fault block 230 indicates a rigid disk backup failure.

Figure 4:
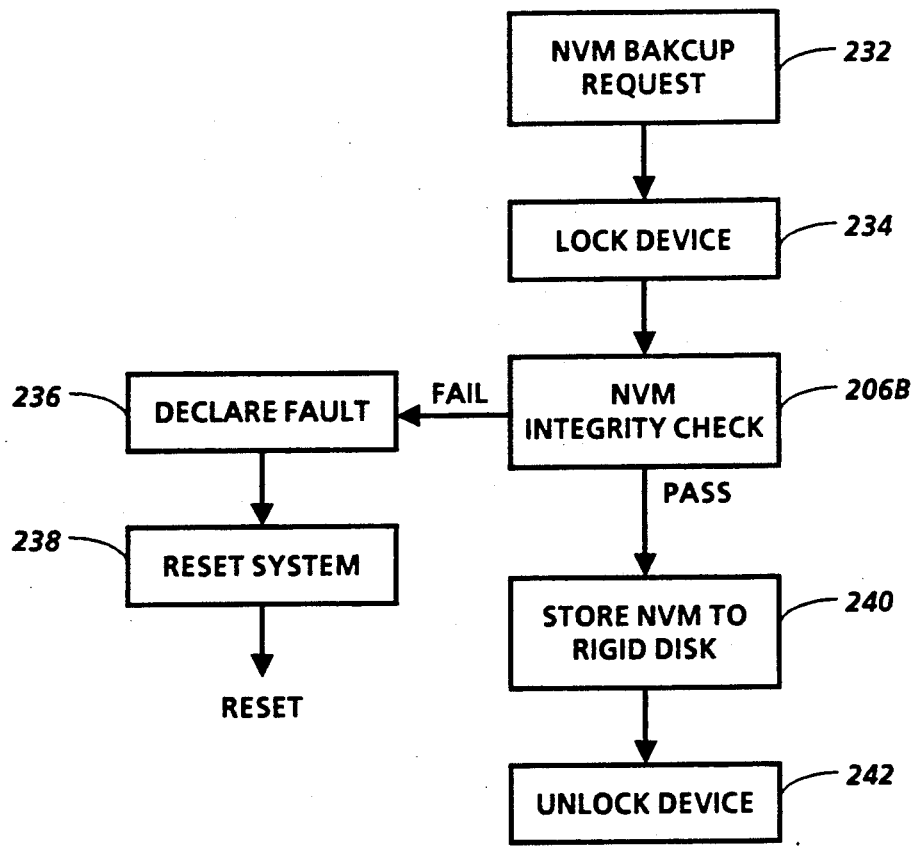

In accordance with the present invention, there is illustrated in FIG. 4, the procedure for the maintenance of a NVM backup/image on the rigid disk. This occurs at cycle down upon completion of a job run or upon the exiting of a diagnostic procedure by the service representative. This is an automatic procedure and is initiated by an NVM backup request as illustrated in block 232.

Upon a NVM backup request, it is essential to prevent any further writing to the NVM device at that time as illustrated by the lock device block 234. Upon the lock device operation, the NVM integrity check 206B is performed. Again, with reference to FIG. 5, a verify patterns operations 208 is performed. Upon completion of the verify patterns operation, a verify checksum 210 is performed. The failure of either the verify patterns or verify checksum operations to pass will result in the declaration of a fault, block 236, and force a reset of the system.

Figure 6:
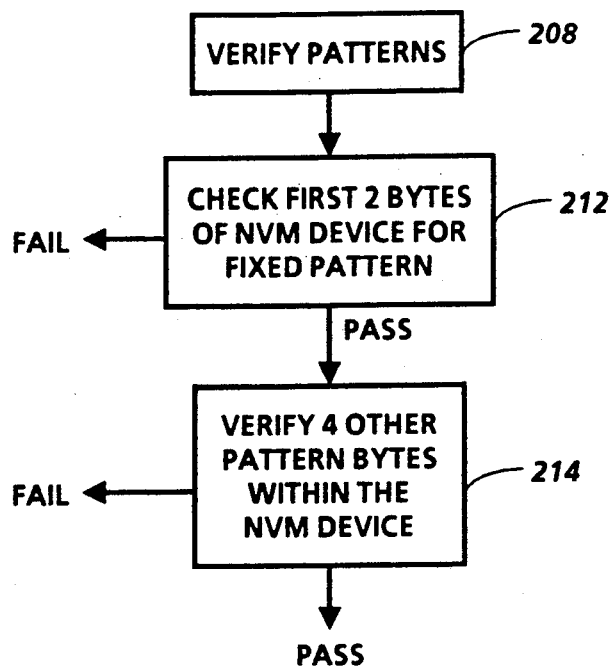
Figure 7:
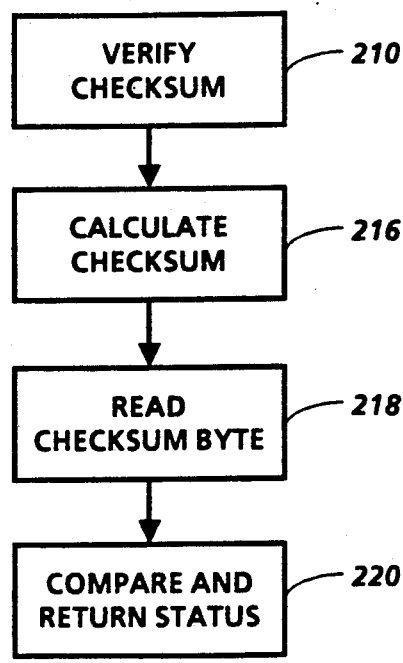

With reference to FIG. 6, the verify patterns operation 208, in a preferred embodiment, is to check the first two bytes of the non-volatile memory to be a predetermined value as shown in block 212. The second portion of the verify patterns test is to verify four other patterns with the patterns stored within the NVM device as shown in block 214. With reference to FIG. 7, the verify checksum operation 210 includes the calculation of a checksum as shown in block 216, the reading or retrieving of a checksum byte as shown in block 218, and the comparison of the calculated checksum and the checksum byte as shown in operation 220.

Returning to FIG. 4, upon the successive completion of the NVM integrity check 206B, the data stored in the NVM device is transferred to the rigid disk for backup as shown by block 240. Upon the transfer of the contents of the NVM device 114C to a suitable location on the rigid disk, the NVM device is then unlocked to enable writing to the NVM device as illustrated in block 242. If there is a failure of the NVM device integrity check 206B, a fault is declared as illustrated at block 236 and there is a reset of the system as shown at block 238, leading to a machine power up reset shown in block 202 of FIg. 3.

While there has been illustrated and described what is at present considered to be a preferred embodiment of the present invention, it will be appreciated that numerous changes and modifications are likely to occur to those skilled in the art, and it is intended to cover in the appended claims all those changes and modifications which fall within the true spirit and scope of the present invention.

We claim:

1. In an image processing apparatus having image processing means for forming an image, a controller for directing the operation of the image processing means, the controller including a mass memory device storing a backup NVM image and a non-volatile memory for dynamically storing critical machine data, the method of automatically maintaining the integrity of the non-volatile memory comprising the steps of:

providing a first non-volatile memory integrity check, responding to a negative non-volatile memory integrity check to declare a non-volatile memory fault, reading the backup NVM image from the mass memory device, providing a second non-volatile memory integrity check, and responding to the second non-volatile memory integrity check to declare a failure of the NVM image on the mass memory device.

* * * * *